United States Patent
Sutardja

(10) Patent No.: US 7,852,245 B2
(45) Date of Patent: Dec. 14, 2010

(54) METHOD AND APPARATUS FOR CALIBRATING A REPLICA DIGITAL-TO-ANALOG CONVERTER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 12/645,712

(22) Filed: Dec. 23, 2009

(65) Prior Publication Data

US 2010/0117877 A1 May 13, 2010

Related U.S. Application Data

(63) Continuation of application No. 12/184,618, filed on Aug. 1, 2008, now Pat. No. 7,639,165.

(60) Provisional application No. 60/955,171, filed on Aug. 10, 2007, provisional application No. 61/080,787, filed on Jul. 15, 2008.

(51) Int. Cl.
*H03M 1/10* (2006.01)
(52) U.S. Cl. ........................ 341/120; 341/144
(58) Field of Classification Search ................. 341/120, 341/144, 118, 155
See application file for complete search history.

(56) References Cited

U.S. PATENT DOCUMENTS

| | | | |
|---|---|---|---|
| 5,153,592 A | 10/1992 | Fairchild et al. |
| 5,666,118 A | 9/1997 | Gersbach |
| 6,642,867 B1 | 11/2003 | Chowdhury et al. |
| 6,744,831 B2 | 6/2004 | Chan |
| 6,956,512 B1 | 10/2005 | San et al. |
| 7,030,790 B1 | 4/2006 | Chen |
| 7,031,456 B2 | 4/2006 | Dyer et al. |
| 7,106,235 B1 | 9/2006 | Yen et al. |
| 7,443,323 B2 | 10/2008 | Rotchford et al. |
| 7,489,123 B2 | 2/2009 | Cohen et al. |
| 7,733,994 B2 * | 6/2010 | Chan .......................... 375/346 |
| 2001/0016021 A1 | 8/2001 | Chan |
| 2003/0227402 A1 | 12/2003 | Starzyk et al. |
| 2005/0001747 A1 | 1/2005 | Kuyel et al. |
| 2005/0069394 A1 | 3/2005 | Dyer et al. |
| 2008/0165040 A1 | 7/2008 | Rotchford et al. |

FOREIGN PATENT DOCUMENTS

| | | |
|---|---|---|
| EP | 0280321 A2 | 8/1988 |
| WO | WO 95/01007 | 1/1995 |

OTHER PUBLICATIONS

The International Search Report and the Written Opinion of the Internation Searching Authority, or the Declaration mailed Dec. 9, 2008 for International Application No. PCT/US2008/072597 filed Aug. 8, 2008; 14 pages.
IEEE Std 802.3TM-2005 (Revision of IEEE Std 802.3-2002 including all approved amendments); IEEE Standard for Information technology—Telecommunications and information exchange between systems—Local and metropolitan area networks—Specific requirements—Part 3: Carrier sense multiple access with collision detection (CSMA/CD) access method and physical layer specifications; IEEE Computer Society; Sponsored by the LAN/MAN Standards Committee; Dec. 9, 2005; Section 1, 628 pages; Section 2, 810 pages; Section 3, 387 pages; Section 4, 454 pages; Section 5, 417 pages.

\* cited by examiner

*Primary Examiner*—Peguy JeanPierre

(57) ABSTRACT

A method and system calibrates a replica analog-to-digital converter. The system includes a first digital-to-analog converter to convert a digital signal into a corresponding first analog signal. A replica digital-to-analog converter generates a second analog signal based on the digital signal. The second analog signal approximately matches the first analog signal. A control module generates a calibration code based on the digital signal. A calibrating digital-to-analog converter generates a third analog signal based on the calibration code. The third analog signal substantially corresponds to the mismatch between the first analog signal and the second analog signal.

20 Claims, 13 Drawing Sheets

| Decimal | Binary ($B_2B_1B_0$) | Thermometer ($C_7C_6C_5C_4C_3C_2C_1$) |
|---|---|---|
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |
FIG. 1A
*Prior Art*
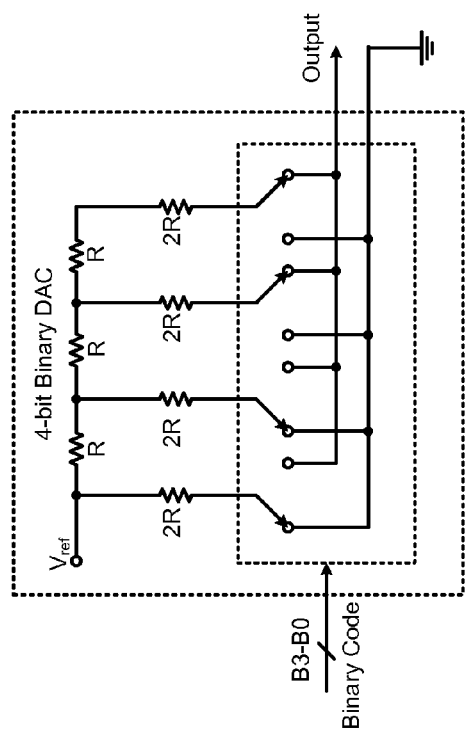
FIG. 1B
*Prior Art*
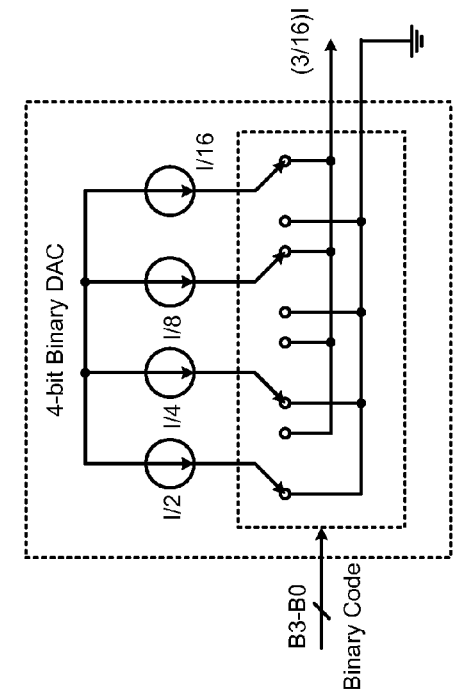
FIG. 1C
*Prior Art*

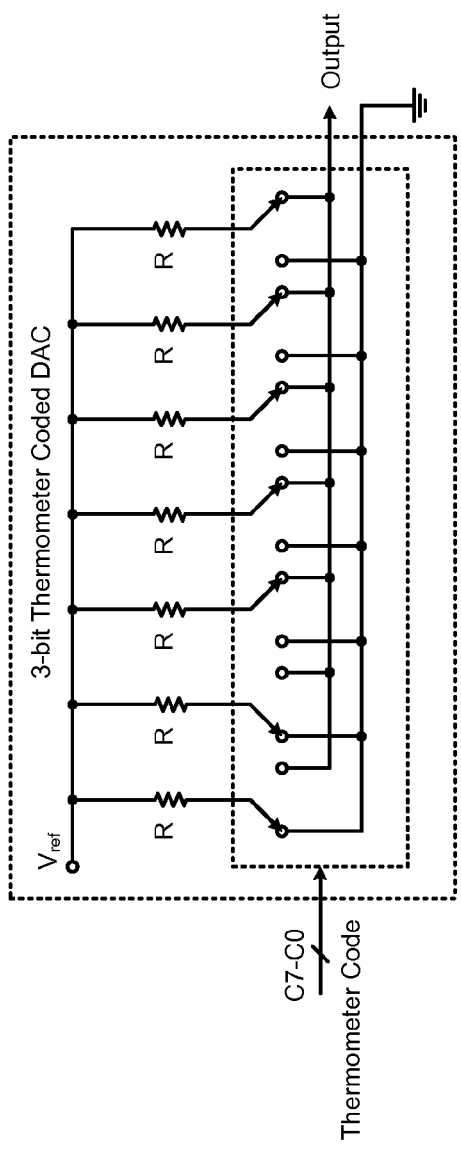
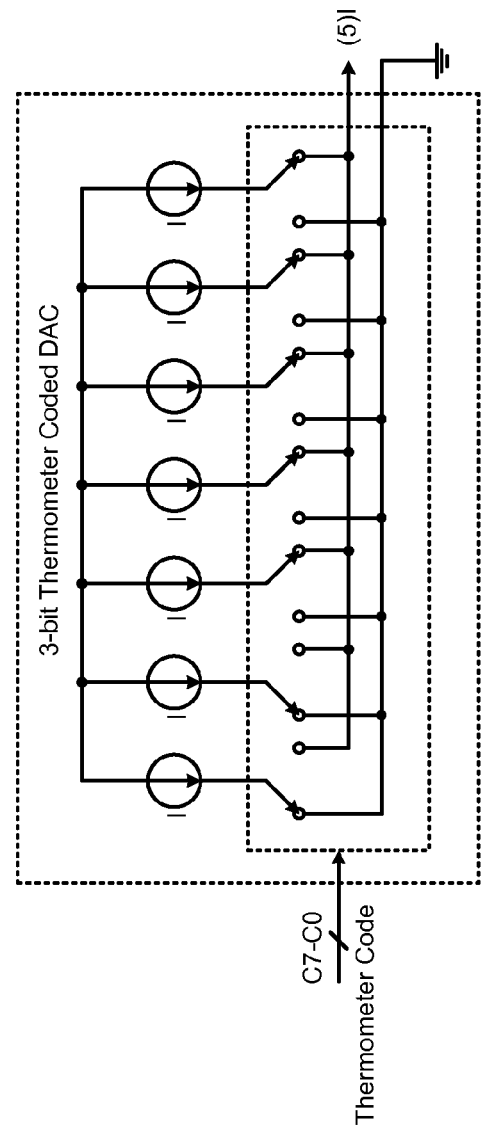

METHOD AND APPARATUS FOR CALIBRATING A REPLICA DIGITAL-TO-ANALOG CONVERTER

CROSS-REFERENCE TO RELATED APPLICATIONS

This application is a continuation of U.S. patent application Ser. No. 12/184,618, filed Aug. 1, 2008, which claims the benefit of U.S. Provisional Application No. 60/955,171, filed Aug. 10, 2007 and U.S. Provisional Application No. 61/080,787 filed Jul. 15, 2008. The disclosures of the above applications are incorporated herein by reference in their entirety.

FIELD

The present disclosure relates to calibrating replica digital-to-analog converters (DACs).

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Digital-to-analog converters (DACs) convert digital signals into analog signals. Typically, an N-bit DAC converts an N-bit digital input into an analog output having a voltage between 0 and $V_{ref}$, where $V_{ref}$ is a reference voltage supplied to the DAC, and N is an integer greater than 1. The value of the analog output changes by $(V_{ref}/2^N)$ when the value of the digital input changes by one least significant bit (LSB). Accordingly, a resolution of the DAC is defined as $V_{ref}/2^N$.

Referring now to FIGS. 1A-1H, DACs can be of different types and may be implemented using circuit elements such as resistors and current sources. For example, DACs may be binary-weighted or thermometer-coded. In FIG. 1A, a table shows a 3-bit binary code and a 3-bit thermometer code that is equivalent to the 3-bit binary code. In FIGS. 1B and 1C, exemplary resistance-based and current-source based 4-bit binary-weighted DACs are shown, respectively. A binary-weighted DAC may include a resistance or a current source for each bit of a binary input. The resistances may be arranged in the form of an R-2R ladder as shown or a resistance string (not shown). The R-2R ladder (or the resistance string) and the current sources are binary-weighted and are connected to a summing point that generates the analog output of the binary-weighted DACs.

In FIGS. 1D and 1E, exemplary resistance-based and current-source based 3-bit thermometer-coded DACs are shown, respectively. A thermometer-coded DAC includes resistance segments or current-source segments. The resistance segments and the current-source segments are of equal value as shown. In other words, the thermometer-coded DACs are linearly (i.e., equally) weighted. For example, the 3-bit thermometer-coded DACs shown include seven equally weighted segments. The resistance segments and the current-source segments are connected to a summing point that generates the output of the thermometer-coded DAC.

In FIGS. 1F-1H, exemplary segmented DACs are shown. Segmented DACs typically comprise a first DAC that converts LSBs of the binary input and a second DAC that converts most significant bits (MSBs) of the binary input. The first and second DACs may include a binary-weighted DAC and a thermometer coded DAC, respectively. Alternatively, both first and second DACs may include thermometer-coded DACs.

In FIGS. 1F and 1G, exemplary resistance-based and current-source based 7-bit segmented DACs are shown, respectively. The 7-bit segmented DACs each comprise a 0-bit binary-weighted DAC that converts 4 LSBs and a 3-bit thermometer-coded DAC that converts 3 MSBs.

In FIG. 1H, an exemplary 6-bit segmented DAC comprises two current-source based 3-bit thermometer-coded DACs that convert 3 LSBs and 3 MSBs, respectively. The G-bit segmented DAC is 100% segmented since the 6-bit segmented DAC comprises fully thermometer-coded DACs. Contrarily, DACs comprising fully binary-weighted DACs are 0% segmented.

Many systems use DACs to convert digital data into analog signals. For example, in communication systems, transmitters use DACs to convert digital data to be transmitted into analog signals. The analog signals are then transmitted over transmission lines.

Referring now to FIG. 2A, a communication device 10 comprises a physical layer (PHY) device 12, a medium access controller (MAC) 14, and a host 16. The communication device 10 may communicate with other communication devices via a transmission medium 18 (hereinafter medium 18 or line 18). The PHY device 12 interfaces the communication device 10 to the medium 18. The MAC 14 provides access control when the communication device 10 communicates with the other communication devices via the medium 18. The host 16 processes data that is transmitted and received via the medium 18.

The communication device 10 may comply with one or more communication standards including the I.E.E.E. 10 Gigabit/second twisted-pair (10GBaseT) Ethernet standard, which is incorporated herein by reference in its entirety. According to the 10GBaseT Ethernet standard, the medium 18 may include unshielded twisted-pair (UTP) wires. The PHY device 12 may transmit and receive signals via the same UTP wires. Consequently, the PHY device 12 may receive a combined signal. The combined signal may comprise a transmit signal transmitted by the PHY device 12 to a remote communication device via the medium 18. Additionally, the combined signal may include a receive signal received by the PHY device 12 from the remote communication device via the medium 18. In other words, the transmit signal may mix with the receive signal.

The transmit signal may be prevented from mixing with the receive signal by using a hybrid in the PHY device 12. Alternatively, instead of using the hybrid, a replica DAC may be used to replicate the transmit signal. The replicated transmit signal is then subtracted from the combined signal to extract the receive signal from the combined signal. The receive signal is then input to a signal processing module of the PHY device 12.

Referring now to FIGS. 2B and 2C, PHY devices with the hybrid and the replica DAC are shown. In FIG. 2B, a PHY device 12-1 comprises a hybrid 20, a transceiver 21-1 that includes a transmitter 22 and a receiver 24, and a digital signal processing (DSP) module 26. The hybrid 20 outputs transmit signals generated by the transmitter 22 to the medium 18. The hybrid 20 outputs receive signals received from the other communication devices to the receiver 24. The hybrid 20 prevents the transmit signals from mixing with the receive signals.

The DSP module 26 generates and outputs digital transmit data to the transmitter 22. The transmitter 22 generates the transmit signals based on the digital transmit data. Additionally, the DSP module 26 processes digital receive data received from the receiver 24. The receiver 24 generates the digital receive data based on the receive signals.

The transmitter 22 may comprise a transmit DAC 28, a filter 30, and a line driver 32. The transmit DAC 28 converts the digital transmit data into analog transmit signals. The filter 30 filters out unwanted signals from the analog transmit signals and outputs filtered transmit signals. The line driver 32 conditions (e.g., amplifies) the filtered transmit signals and generates the transmit signals that are suitable for transmission by the hybrid 20 via the medium 18.

The receiver 24 may comprise an amplifier 34, a filter 36, and an analog-to-digital converter (ADC) 38. The amplifier 34 amplifies the receive signals and outputs amplified receive signals. The filter 36 filters out noise from the amplified receive signals and outputs filtered receive signals. The ADC 38 converts the filtered receive signals into the digital receive data.

In FIG. 2C, a PHY device 12-2 comprises a transceiver 21-2. The transceiver 21-2 comprises all the components of the transceiver 21-1 except the hybrid 20. Additionally, the transceiver 21-2 comprises a replica DAC 52, a amplifier 53, and a subtractor 66. The transceiver 21-2 transmits signals to the remote communication device via the line 18. The transceiver 21-2 receives signals from the remote communication device via the line 18 (i.e., via the same UTP wires). In other words, the transceiver 21-2 transmits and receives signals via the same UTP wires. Consequently, the transceiver 21-2 receives the combined signal comprising the transmit and receive signals that are transmitted and received by the transceiver 21-2 via the same UTP wires.

The transceiver 21-2 extracts the receive signal from the combined signal by removing the transmit signal generated by the transmit DAC 28 from the combined signal. Specifically, the transceiver 21-2 uses the replica DAC 52 that is a closely matched replica of the transmit DAC 28 to replicate the transmit signal. The replicated transmit signal generated by the replica DAC 52 is amplified by the amplifier 53 to generate an amplified replica signal. The amplifier 53 has a gain that matches the gain of the line driver 32. The amplified replica signal is then subtracted from the combined signal to extract the receive signal from the combined signal.

Ideally, a clean receive signal may be generated by removing the transmit signal from the combined signal. Practically, however, the transmit signal cannot be completely removed from the combined signal when the replicated transmit signal does not match the transmit signal due to variations in size of the circuit elements used to implement the replica and transmit DACs 52, 28.

Generally, the variations are inversely proportional to the size of the circuit elements. In other words, as the size of the circuit elements increases, the variations decrease. Accordingly, the replica and transmit DACs 52, 28 may be implemented using large circuit elements to minimize the variations.

Using large circuit elements, however, may be disadvantageous since large circuit elements may dissipate more power. Additionally, using large circuit elements may be impractical when the maximum size of the circuit elements is limited by high signal frequencies (e.g., when communication devices use the 10GBaseT Ethernet standard).

SUMMARY

A system comprises a first digital-to-analog converter (DAC), a replica DAC, a control module, and a calibrating DAC. The first DAC receives a first input and generates a first analog output based on the first input. The replica DAC receives the first input and generates a replica analog output based on the first input. The control module generates a first control signal based on the first input. The calibrating DAC generates a calibration analog output based on the first control signal. The calibration analog output adjusts the replica analog output.

In another feature, the system further comprises a summing circuit and a comparing module. The summing circuit generates a sum of the replica analog output and the calibration analog output. The comparing module compares the sum to the first analog output and generates a second control signal. The control module generates the first control signal based on the second control signal.

In other features, a transceiver comprises the system and receives a combined signal comprising the first analog output and a receive signal received via a medium. The transceiver further comprises a subtractor that removes the first analog output from the combined signal by subtracting a sum of the replica analog output and the calibration analog output.

In other features, a first size of first circuit components of the first DAC is greater than a second size of second circuit components of the replica DAC. A first accuracy of the first DAC is greater than a second accuracy of the replica DAC.

In other features, the first DAC and the replica DAC include segmented DACs. The first DAC and the replica DAC include thermometer-coded DACs.

In another feature, the system further comprises a thermometer code generator that generates thermometer codewords and that outputs the thermometer codewords as the first input.

In another feature, the first DAC and the replica DAC each includes a plurality of segments. S adjacent segments of the first DAC and corresponding S adjacent segments of the replica DAC convert the first input and generate the first analog output and the replica analog output, respectively, where S is an integer greater than 1.

In another feature, the control module iteratively generates control codewords for one of the thermometer codewords and outputs the control codewords as the first control signal.

In another feature, the control module stores one of the control codewords for one of the thermometer codewords when the first analog output matches a sum of the replica analog output and the calibration analog output generated based on one of one of the thermometer codewords and one of the control codewords, respectively.

In another feature, the system further comprises a thermometer code converter that receives a binary codeword, that converts the binary codeword into one of the thermometer codewords, and that outputs one of the thermometer codewords as the first input.

In another feature, the control module outputs one of the control codewords as the first control signal when the thermometer code converter receives the binary codeword.

In another feature, the system further comprises a multiplexer that multiplexes outputs of the thermometer code generator and the thermometer code converter as the first input. The control module controls the multiplexer.

In another feature, the system further comprises a summing circuit and a comparing module. The summing circuit generates a sum of the replica analog output and the calibration analog output. The comparing module compares the first analog output to the sum and generates a second control signal. The control module generates one of the control codewords based on the second control signal.

In other features, a transceiver comprises the system and further comprises a subtractor that receives a combined signal from a medium coupled to the transceiver. The combined signal includes the first analog output and a receive signal received from the medium. The subtractor subtracts the sum from the combined signal and outputs the receive signal.

In another feature, a height of the first DAC is less than 20K Lambda when the first input includes codewords transmitted according to the I.E.E.E. 10GBaseT Ethernet communication standard.

In another feature, the transceiver further comprises switches that selectively switch the transceiver from a normal mode to a calibration mode, that isolate the transceiver from the medium in the calibration mode, and that isolate the system from the subtractor in the calibration mode.

In still other features, a method comprises receiving a first input, generating a first analog output based on the first input by converting the first input using a first digital-to-analog converter (DAC), and generating a replica analog output based on the first input by converting the first input using a replica DAC. The method further comprises generating a first control signal based on the first input and generating a calibration analog output based on the first control signal by converting the first control signal using a calibrating DAC. The method further comprises adjusting the replica analog output based on the calibration analog output.

In other features, the method further comprises generating a sum of the replica analog output and the calibration analog output. The method further comprises generating a second control signal by comparing the sum to the first analog output and generating the first control signal based on the second control signal.

In other features, the method further comprises receiving a combined signal comprising the first analog output and a receive signal received via a medium. The method further comprises removing the first analog output from the combined signal by subtracting a sum of the replica analog output and the calibration analog output and outputting the receive signal.

In other features, the method further comprises providing the first DAC having first circuit components of a first size and providing the replica DAC having second circuit components of a second size that is less than the first size.

In another feature, the method further comprises providing the first DAC having a first accuracy that is greater than a second accuracy of the replica DAC.

In another feature, the method further comprises generating the first analog output and the replica analog output using segmented DACs.

In another feature, the method further comprises generating the first analog output and the replica analog output using thermometer-coded DACs.

In another feature, the method further comprises generating thermometer codewords and outputting the thermometer codewords as the first input.

In another feature, the method further comprises generating the first analog output and the replica analog output by converting the first input using S adjacent segments of the first DAC and corresponding S adjacent segments of the replica DAC, respectively, where S is an integer greater than 1.

In another feature, the method further comprises iteratively generating control codewords for one of the thermometer codewords and outputting the control codewords as the first control signal.

In another feature, the method further comprises storing one of the control codewords for one of the thermometer codewords when the first analog output matches a sum of the replica analog output and the calibration analog output generated based on one of the thermometer codewords and one of the control codewords, respectively.

In another feature, the method further comprises receiving a binary codeword, converting the binary codeword into one of the thermometer codewords, and outputting one of the thermometer codewords as the first input.

In another feature, the method further comprises outputting one of the control codewords as the first control signal when the thermometer code converter receives the binary codeword.

In other features, the method further comprises generating a sum of the replica analog output and the calibration analog output. The method further comprises generating a second control signal by comparing the first analog output to the sum and generating one of the control codewords based on the second control signal.

In another feature, the method further comprises providing the first DAC having a height less than 20K Lambda when the first input includes codewords transmitted according to the I.E.E.E. 10GBaseT Ethernet communication standard.

In another feature, the method further comprises selectively switching from a normal mode to a calibration mode and isolating from the medium in the calibration mode.

In still other features, a system comprises first digital-to-analog converting (DAC) means for converting a first input and generating a first analog output based on the first input and replica DAC means for converting the first input and generating a replica analog output based on the first input. The system further comprises control means for generating a first control signal based on the first input and calibrating DAC means for generating a calibration analog output based on the first control signal. The calibration analog output adjusts the replica analog output.

In other features, the system further comprises summing means for generating a sum of the replica analog output and the calibration analog output and comparing means for comparing the sum to the first analog output and generating a second control signal. The control means generates the first control signal based on the second control signal.

In other features, a transceiver comprises the system and receives a combined signal comprising the first analog output and a receive signal received via a medium. The transceiver further comprises subtracting means for removing the first analog output from the combined signal by subtracting a sum of the replica analog output and the calibration analog output.

In other features, a first size of first circuit components of the first DAC means is greater than a second size of second circuit components of the replica DAC means. A first accuracy of the first DAC means is greater than a second accuracy of the replica DAC means.

In another feature, the first DAC means and the replica DAC means each includes segmented DAC means for converting the first input. The first DAC means and the replica DAC means each includes thermometer-coded DAC means for converting the first input.

In another feature, the system further comprises thermometer code generating means for generating thermometer codewords. The thermometer code generating means outputs the thermometer codewords as the first input.

In another feature, the first DAC means and the replica DAC means each includes a plurality of segments. S adjacent segments of the first DAC means and corresponding S adjacent segments of the replica DAC means convert the first input and generate the first analog output and the replica analog output, respectively, where S is an integer greater than 1.

In another feature, the control means iteratively generates control codewords for one of the thermometer codewords and outputs the control codewords as the first control signal.

In another feature, the control means stores one of the control codewords for one of the thermometer codewords when the first analog output matches a sum of the replica analog output and the calibration analog output generated based on one of the thermometer codewords and one of the control codewords, respectively.

In another feature, the system further comprises thermometer code converting means for converting a binary codeword into one of the thermometer codewords. The thermometer code converting means receives the binary codeword and outputs one of the thermometer codewords as the first input.

In another feature, the control means outputs one of the control codewords as the first control signal when the thermometer code converting means receives the binary codeword.

In another feature, the system further comprises multiplexing means for multiplexing outputs of the thermometer code generating means and the thermometer code converting means as the first input. The control means controls the multiplexing means.

In other features, the system further comprises summing means for generating a sum of the replica analog output and the calibration analog output. The system further comprises comparing means for comparing the first analog output to the sum and generating a second control signal. The control means generates one of the control codewords based on the second control signal.

In other features, a transceiver comprises the system and further comprises subtracting means for receiving a combined signal from a medium coupled to the transceiver. The combined signal includes the first analog output and a receive signal received from the medium. The subtracting means subtracts the sum from the combined signal and outputs the receive signal.

In another feature, a height of the first DAC means is less than 20K Lambda when the first input includes codewords transmitted according to the I.E.E.E. 10GBaseT Ethernet communication standard.

In another feature, the transceiver further comprises switching means for selectively switching the transceiver from a normal mode to a calibration mode, for isolating the transceiver from the medium in the calibration mode, and for isolating the system from the subtracting means in the calibration mode.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 1A is a table showing a binary code and an equivalent thermometer code according to the prior art;

FIG. 1B is a resistance-based binary-weighted digital-to-analog converter (DAC) according to the prior art;

FIG. 1C is a current-source based binary-weighted DAC according to the prior art;

FIG. 1D is a resistance-based thermometer-coded DAC according to the prior art;

FIG. 1E is a current-source based thermometer-coded DAC according to the prior art;

DESCRIPTION

Figure 1F:
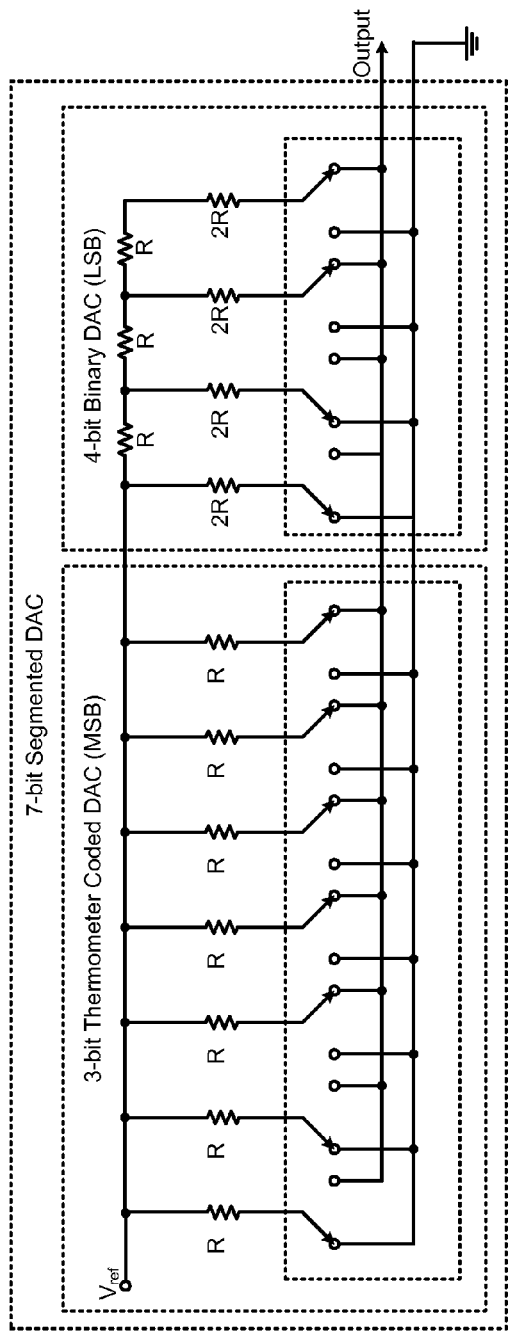
FIG. 1F is a segmented DAC comprising resistance-based binary-weighted and thermometer-coded DACs according to the prior art.
Figure 1G:
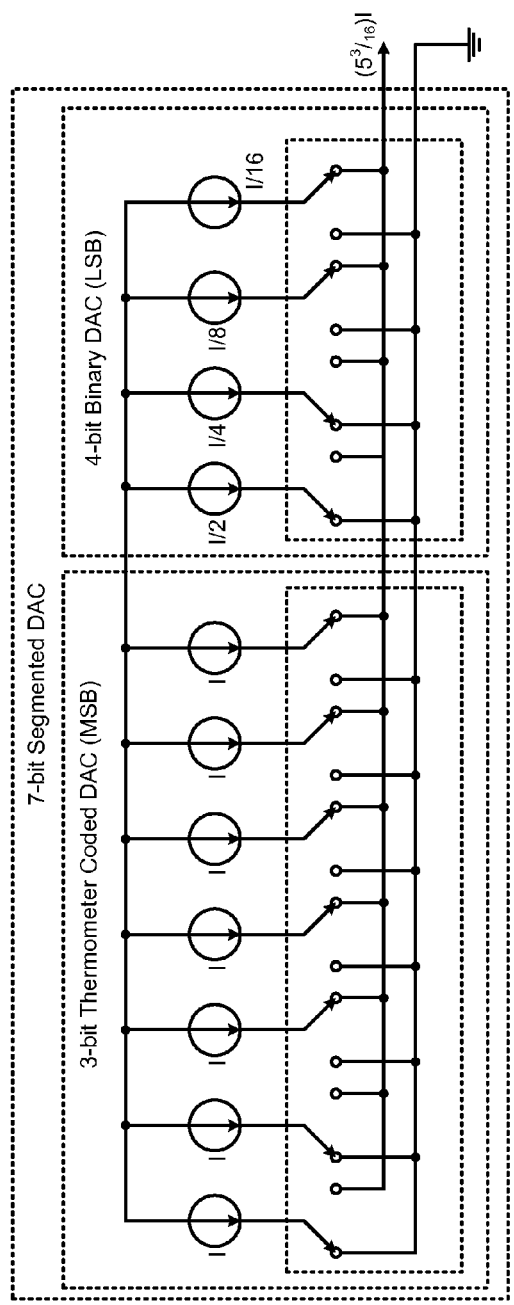
FIG. 1G is a segmented DAC comprising current-source based binary-weighted and thermometer-coded DACs according to the prior art.
Figure 1H:
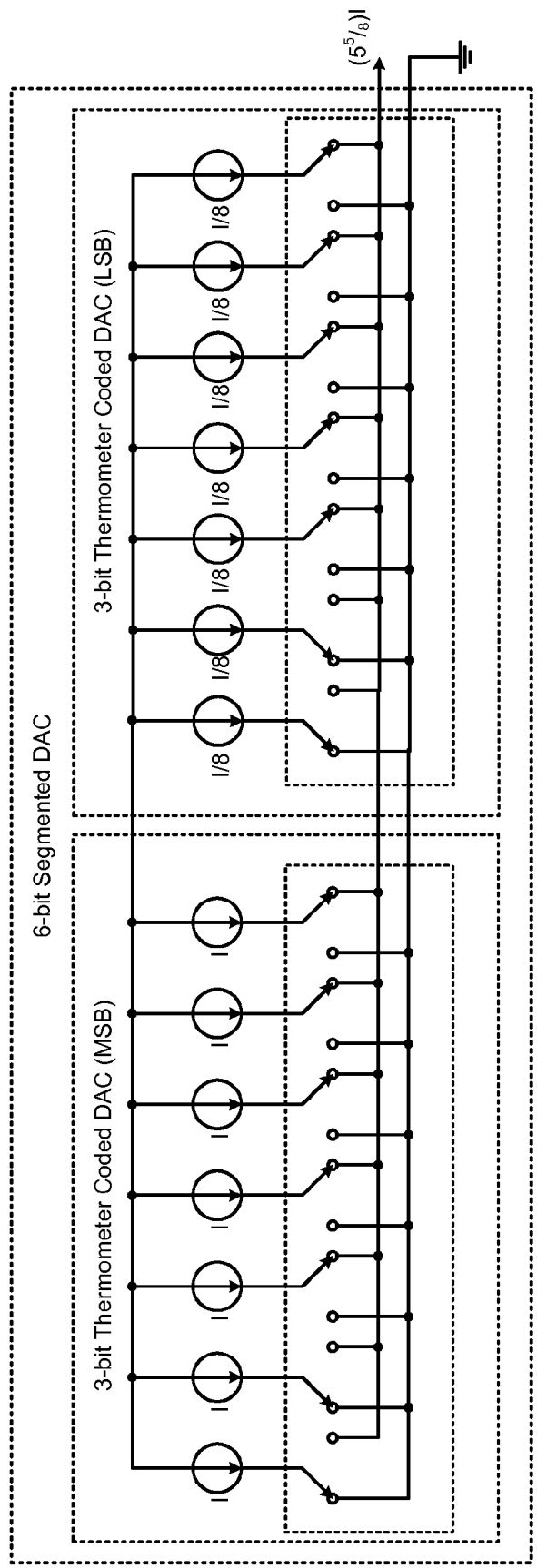
FIG. 1H is a segmented DAC comprising current-source based thermometer-coded DACs according to the prior art.
Figure 2A:
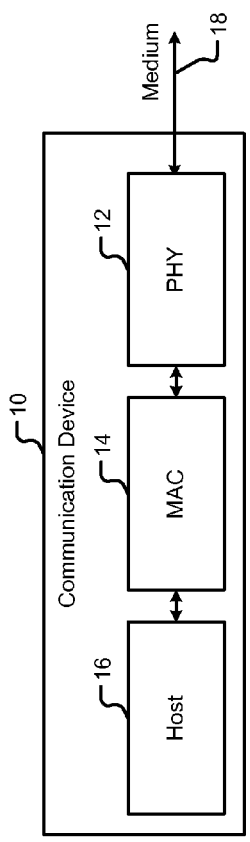
FIG. 2A is a functional block diagram of a communication device according to the prior art.
Figure 2B:
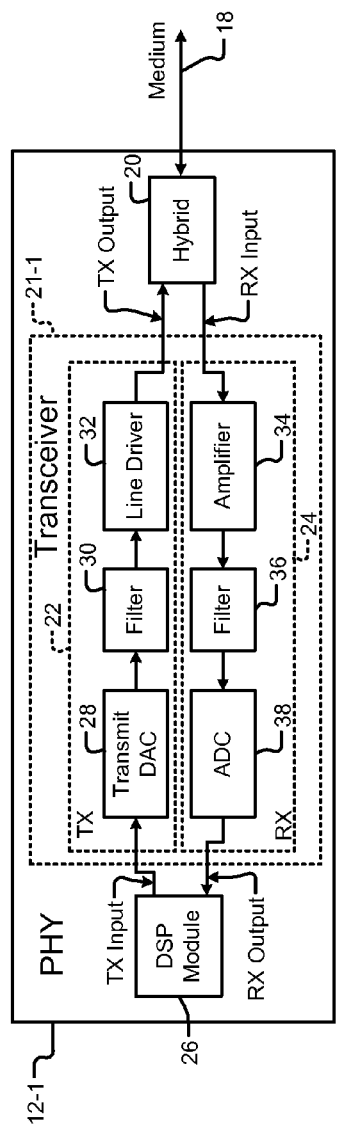
FIG. 2B is a functional block diagram of a physical layer (PHY) device of a communication device according to the prior art.
Figure 2C:
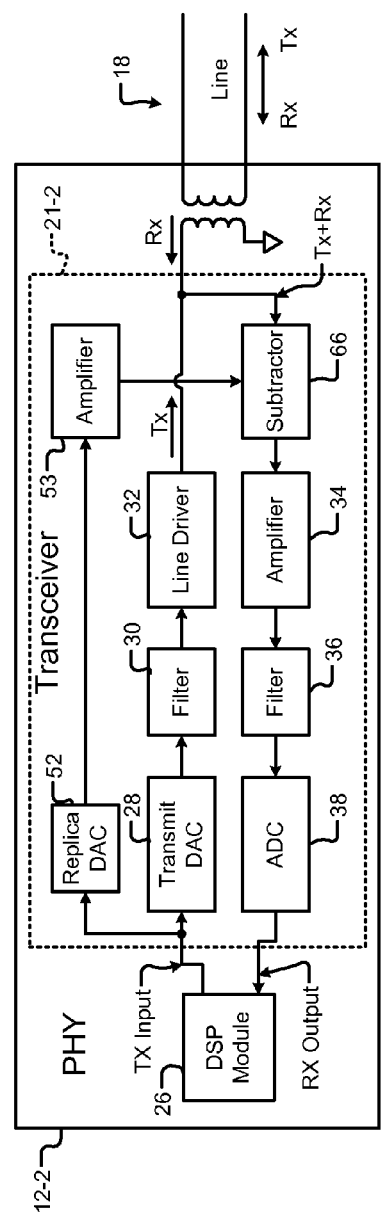
FIG. 2C is a functional block diagram of a PHY device of a communication device according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Replica digital-to-analog converters (DACs) manufactured using circuit elements that are smaller than the circuit elements of transmit DACs may be used to replicate transmit signals generated by the transmit DACs. For example, the size of the circuit elements of the replica DACs may be a fraction of the size of the circuit elements of the transmit DACs. For example, the fraction may be $1/8^{th}$. The circuit elements of the replica DACs can carry only a fraction of the current carried by the circuit elements of the transmit DACs. Accordingly, the smaller replica DACs may consume less power than the transmit DACs.

The smaller replica DACs, however, may be less accurate than the transmit DACs since the size of the smaller circuit elements of the smaller replica DACs may vary more than the size of the circuit elements of the transmit DACs. For example, replica DACs having circuit elements $\frac{1}{8}^{th}$ the size of the circuit elements of transmit DACs may be approximately 1.5 bits less accurate than the transmit DACs.

The accuracy of replica DACs that are smaller than the transmit DACs can be increased to match the accuracy of the transmit DACs by calibrating the replica DACs. Specifically, a parallel-path calibrating DAC may be used to calibrate a replica DAC so that the replica DAC matches a transmit DAC. The calibrating DAC may be specifically designed to compensate only the amount of mismatch between the transmit DAC and the replica DAC. Accordingly, the calibrating DAC may have a calibration range equal to 1 or 2 least significant bits (LSBs) of the replica DAC. The accuracy of the replica DAC may be further increased by providing a fractional LSB calibration.

Additionally, the calibration may be simplified by segmenting the replica DAC and calibrating segments of the replica DAC to match corresponding segments of the transmit DAC. Specifically, the replica DAC may be segmented into a plurality of linearly (i.e. equally) weighted segments. The linearly weighted segments may include resistance segments or current-source segments having resistances or current sources of equal value, respectively. Typically, the replica DAC may be segmented into 32 to 64 segments. Accordingly, the size of the calibrating DAC, which is smaller than the replica DAC, may be negligible relative to the size of the transmit DAC.

During calibration, the outputs of the segments of the replica DAC may be calibrated to match the actual outputs of the transmit DAC instead of ideal or target outputs of the corresponding segments of the transmit DAC. This is advantageous because the actual outputs may include effects of variations in size of the circuit elements used to implement the transmit DAC. Consequently, calibrating the segments of the replica DAC to mimic the variations of the segments of the transmit DAC may yield better calibration than calibrating the segments of the replica DAC to match the ideal or target outputs of the segments of the transmit DAC.

Specifically, corresponding segments of the replica and transmit DACs are compared and matched using the calibrating DAC. In the context of calibration, the term matching means the following. For example, let the size of the replica DAC be $\frac{1}{8}^{th}$ the size of the transmit DAC. A segment of the replica DAC matches a corresponding segment of the transmit DAC when the ratio of the segment of the replica DAC to the corresponding segment of the transmit DAC is ⅛.

The power consumed by the transmit and replica DACs may be further reduced by decreasing the height of the transmit DAC. For example, when used in communication devices that comply with the 10GBaseT standard, the height of the transmit DAC may be less than 20K Lambda. Specifically, minimum cascode and switch sizes needed for a given segment of the replica DAC may be initially determined and used as lower limits. The sizes can then be increased until a desired accuracy requirement relative to the transmit DAC is met. The size of the transmit DAC is then determined based on a ratio of the size of the transmit DAC to the size of the replica DAC that yields the desired accuracy. For example, the size of the transmit DAC can be approximately eight times the size of the replica DAC when the desired accuracy of the replica DAC is approximately 1.5 bits less than the accuracy of the transmit DAC.

The replica DAC may be less accurate than the transmit DAC. For example, the replica DAC may be approximately 1.5 bits less accurate than the transmit DAC when the size of the replica DAC can be approximately $\frac{1}{8}^{th}$ the size of the transmit DAC. The deficiency in the accuracy of the replica DAC due to the smaller size of the replica DAC can be corrected using the calibrating DAC.

The calibration of the replica DAC using the calibrating DAC is now discussed in detail. Throughout the disclosure, the use and calibration of the replica DAC is discussed using communication devices as an example only. Replica DACs may be used to replicate signals generated by DACs in many other systems. Accordingly, the teachings of this disclosure relating to the calibration of the replica DAC may be implemented in many other systems.

Figure 3A:
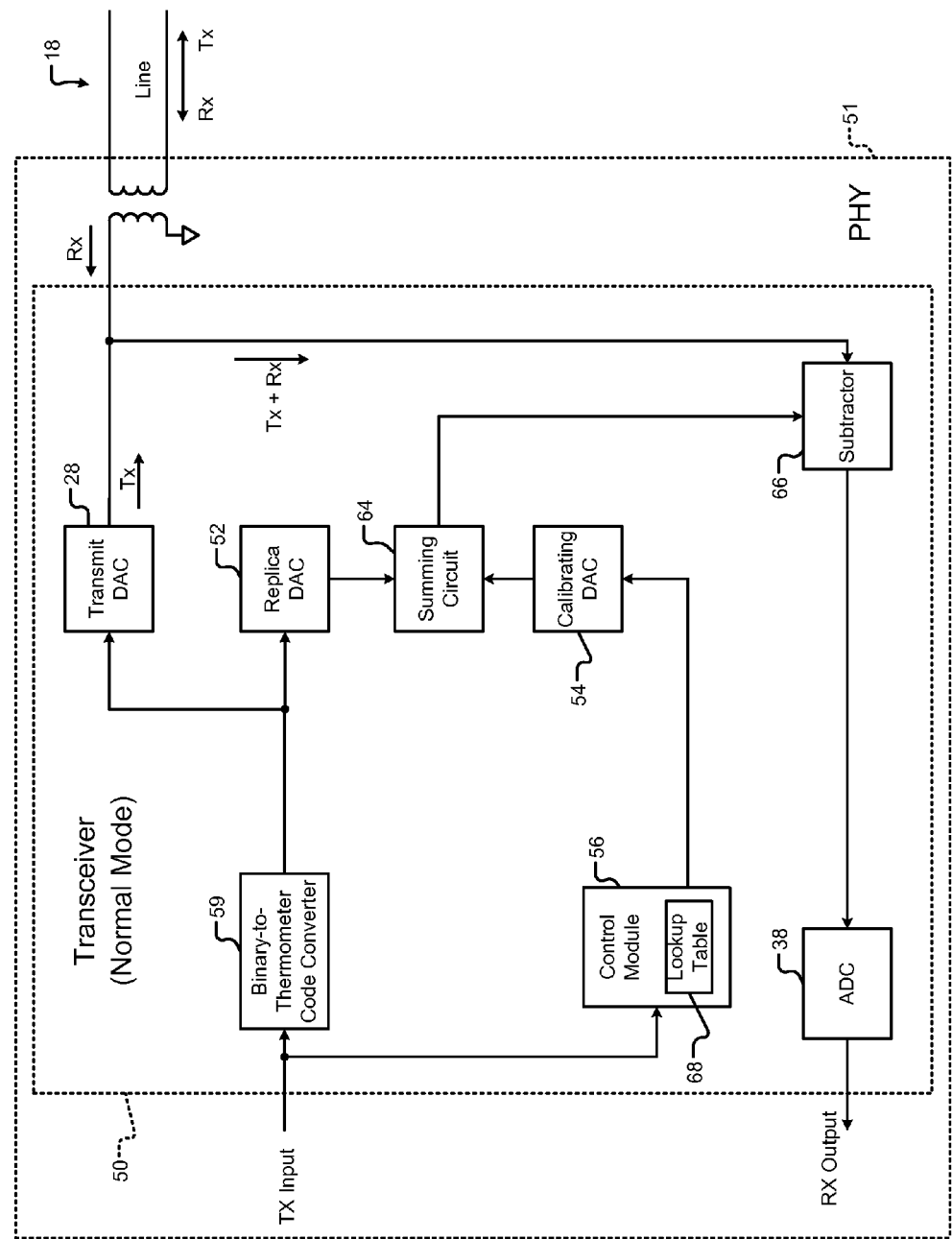
FIG. 3A is a functional block diagram of a transceiver of a communication device operating in a normal mode according to the present disclosure.
Figure 3B:
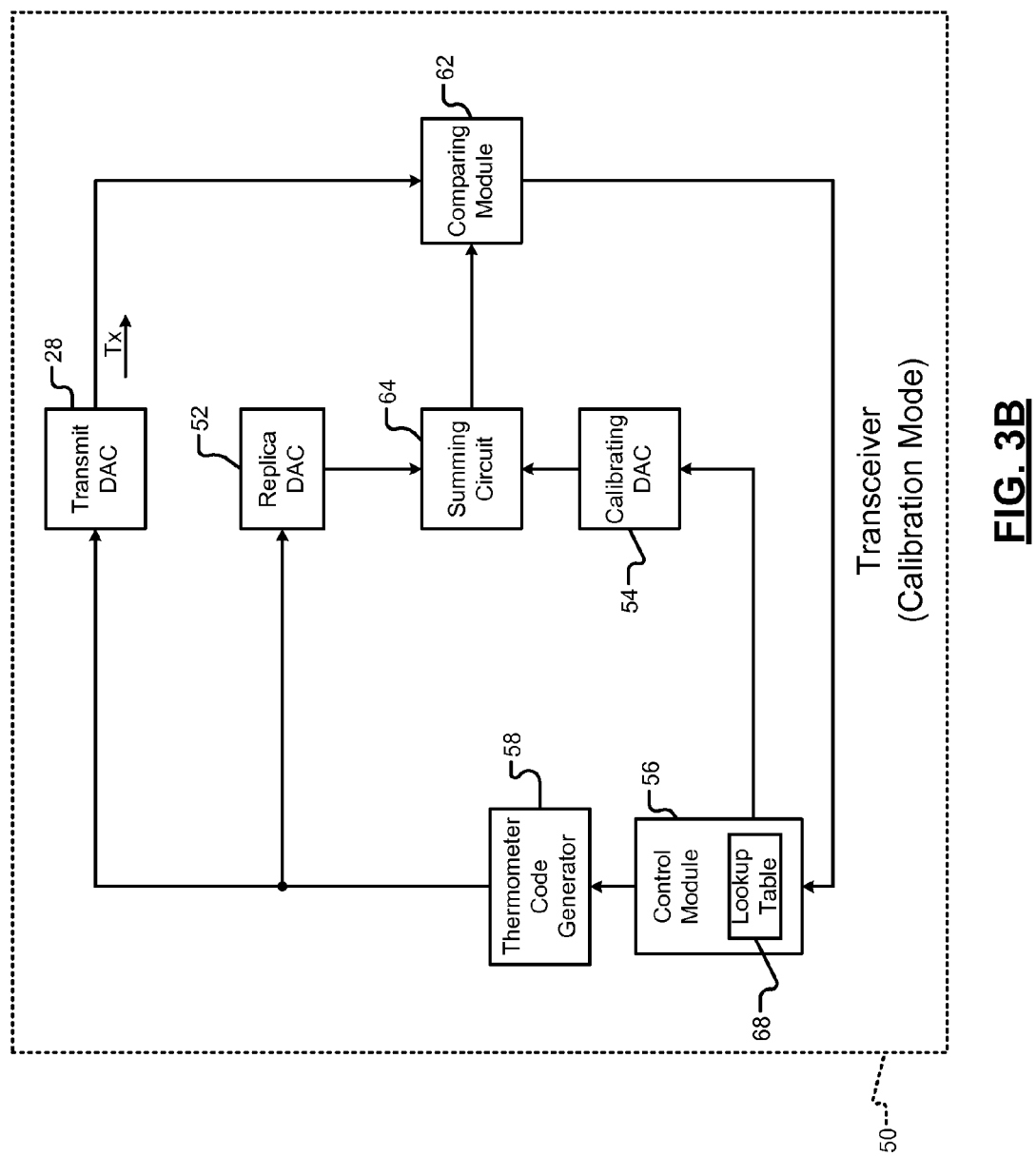
FIG. 3B is a functional block diagram of a transceiver of a communication device operating in a calibration mode according to the present disclosure.
Figure 3C:
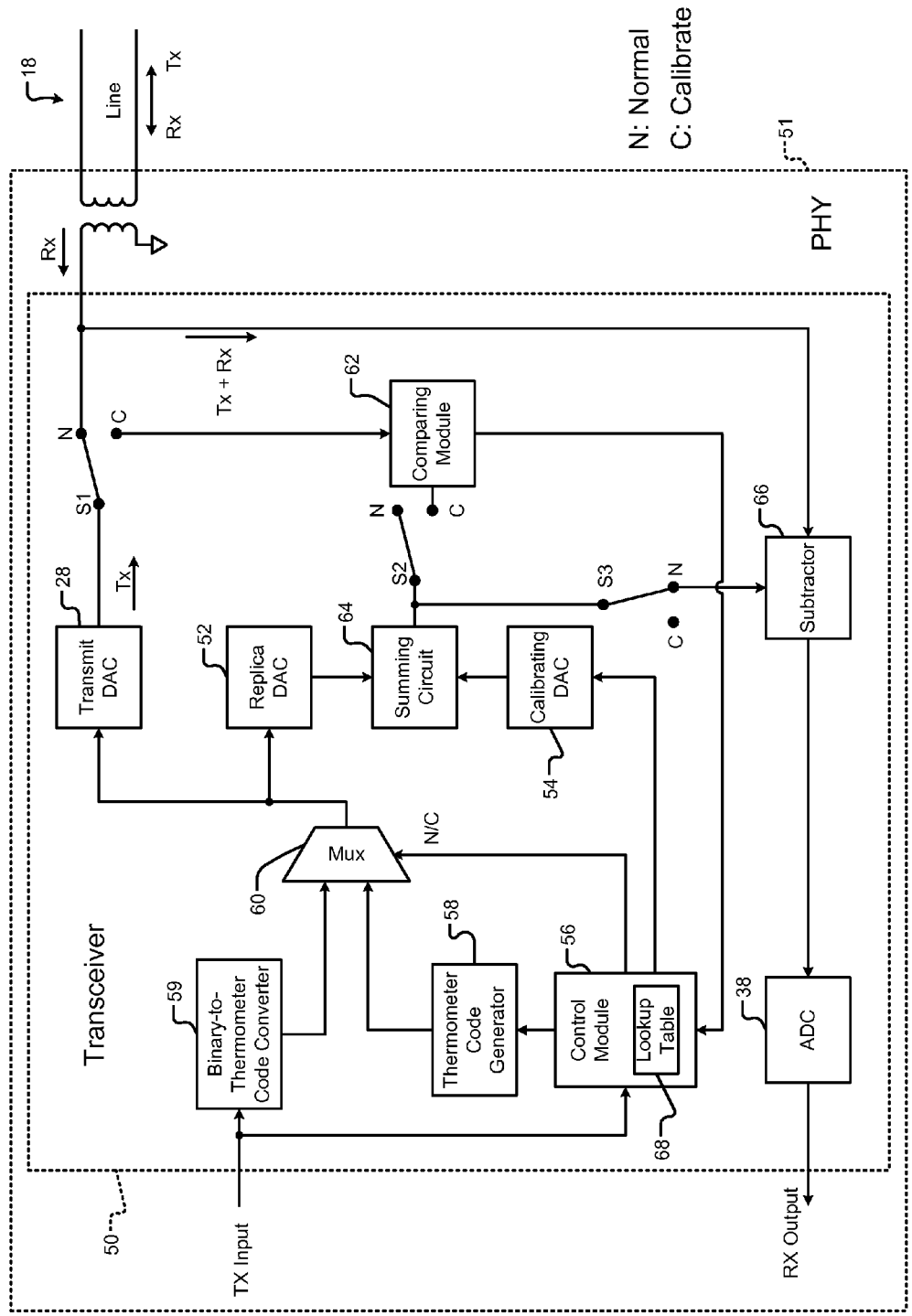
FIG. 3C is a functional block diagram of a transceiver of a communication device capable of operating in a normal mode or a calibration mode according to the present disclosure.

Referring now to FIGS. 3A-3C, an exemplary system for calibrating replica DACs is shown. For example only, a physical layer (PHY) device 51 comprising a transceiver 50 that utilizes a calibrating DAC 54 according to the present disclosure is shown in FIGS. 3A-3C. The use of the calibrating DAC 54 is discussed in three parts as follows:

First, the use of the calibrating DAC 54 in a normal mode of operation of the transceiver 50 is discussed in conjunction with FIG. 3A. For simplicity, only the modules, circuitry, and discussion related to the normal mode of operation are included. The modules, circuitry, and discussion related to calibration are omitted.

Next, a calibration mode of operation of the transceiver 50 is discussed in conjunction with FIG. 3B. Calibration of the replica DAC 52 using the calibrating DAC is discussed in detail. For simplicity, only the modules, circuitry, and discussion related to calibration are included. The modules, circuitry, and discussion related to normal operation are omitted.

Finally, all the modules and circuitry related to normal mode and the calibration mode of operation of the transceiver 50 are shown in FIG. 3C. Switching between the normal mode and the calibration mode is described. Additional possible implementations are briefly discussed.

FIG. 3A illustrates the normal mode of operation of the transceiver 50. The transceiver 50 comprises the transmit DAC 28, the replica DAC 52, the calibrating DAC 54, a summing circuit 64, a control module 56, a binary-to-thermometer code converter 59, the subtractor 66, and the analog-to-digital converter (ADC) 38.

The transmit DAC 28 and the replica DAC 52 are linearly weighted (i.e., thermometer-coded) DACs. The replica DAC 52 is smaller in size than the transmit DAC 28 and consumes less power than the transmit DAC 28. For example only, the ratio of the size of the circuit elements of the replica DAC 52 to the size of the circuit elements of the transmit DAC 28 is 1/P, where P is an integer greater than 1. For example only, P=8.

The calibrating DAC 54 calibrates the replica DAC 52 to match the transmit DAC 28. The calibration process, which is explained in detail below, generates calibrating codes. The control module 56 stores calibrating codes in a lookup table 68.

In use, the binary-to-thermometer code converter 59 converts binary data to be transmitted into thermometer codes. The thermometer codes are output to the transmit and replica DACs 28, 52. Based on the thermometer codes, the transmit DAC 28 generates a transmit signal (Tx) that is transmitted over the line 18. Additionally, based on the thermometer codes, the replica DAC 52 generates a replica signal that approximately matches the transmit signal (Tx).

The control module 56 looks up calibrating codes corresponding to the binary data to be transmitted from the lookup table 68. The control module 56 outputs the calibrating codes to the calibrating DAC 54. The calibrating DAC 54 converts the calibrating codewords and generates a signal that compensates for mismatch between the transmit signal (Tx) and the replica signal.

The summing circuit 64 sums the outputs of the replica DAC 52 and the calibrating DAC 54. The sum is substantially equal to the output of the transmit DAC 28. In other words, the sum is a replica of the transmit signal (Tx) transmitted by the transmit DAC 28. Accordingly, the sum is called the replicated transmit signal. Depending on the accuracy of calibration, the term substantially equal means, for example, with an error of approximately ±5%. In some implementations, the term substantially equal may mean any number less than ±1% or any number between ±1% and ±5%.

When the transmit DAC transmits the transmit signal (Tx) over the line 18, the transceiver 50 receives the combined signal (Tx+Rx) via the line 18. The combined signal (Tx+Rx) includes the transmit signal transmitted by the transmit DAC 28 via the line 18 and the receive signal (Rx) received by the transceiver 50 from another device (not shown) via the line 18.

The subtractor 66 removes the transmit signal (Tx) from the combined signal (Tx+Rx) by subtracting the sum (i.e., the replicated transmit signal) from the combined signal and outputs the clean receive signal. The clean receive signal is output to the ADC 38. Accordingly, the transceiver 50 can be used in the communication device to generate clean receive signals that do not include transmit signals generated by the transmit DAC 28.

FIG. 3B illustrates the calibration operation. During calibration, the transceiver 50 utilizes the transmit DAC 28, the replica DAC 52, the calibrating DAC 54, the summing circuit 64, and the control module 56. Additionally, for calibration purposes, the transceiver 50 further comprises a thermometer code generator 58 and a comparing module 62.

The control module 56 generates a control signal to begin calibration. The thermometer code generator 58 generates thermometer codes for all the binary codewords that may be transmitted during normal operation. The transmit and replica DACs 28, 52 convert the thermometer codes and generate first and second analog outputs, respectively. The control module 56 generates calibrating codes. The calibrating DAC 54 converts the calibrating codes and generates a third analog output. The third analog output compensates any difference that may exist between the first and second analog outputs.

The summing circuit 64 sums the second and third analog outputs. The comparing module 62 compares the sum to the first analog output and indicates whether the sum is substantially equal to the first analog output. The control module 56 generates the calibrating codes until the sum substantially equals the first analog output. The control module 56 stores the calibrating code that substantially equalizes the sum and the first analog output. The control module 56 stores calibrating codes for every thermometer code.

The thermometer codes may be T bits wide, where T is an integer greater than 1. The transmit and replica DACs 28, 52 are segmented into T segments each when the thermometer code is T bits wide. In other words, the transmit and replica DACs 28, 52 include, for example, T resistance segments or T current source segments depending on implementation.

When the thermometer code changes by one bit, the number of segments that convert the thermometer code also changes by one segment. Accordingly, the outputs of the transmit and replica DACs 28, 52 change by one least significant bit (LSB) when the thermometer code changes by one LSB. Additionally, the same corresponding segments in each of the transmit and replica DACs 28, 52 convert a given thermometer code.

Since the replica DAC 52 is smaller than the transmit DAC 28, the replica DAC 52 may be less accurate than the transmit DAC 28. To simplify calibration, the reference voltage supplied to the replica DAC 52 may be slightly less than the reference voltage supplied to the transmit DAC 28. Consequently, the second analog output of the replica DAC 52 is typically less than or equal to the first analog output of the transmit DAC 28. Accordingly, the calibrating DAC 54 can calibrate the replica DAC 52 by simply supplying additional current or voltage that is sufficient to match the current or voltage of the transmit DAC 28.

In some implementations, positive and negative reference voltages may be supplied to the calibrating DAC 54. Accordingly, the third analog output can have positive and negative values. The positive and negative values of the third analog output can be used to increase and decrease the second analog output of the replica DAC 52 such that the sum of the second and third analog outputs matches the first analog output of the transmit DAC 28.

The calibrating codes may include binary codes or thermometer codes. For example only, calibration is explained using binary codes having K bits, where K is an integer greater than or equal to one. K may be small (e.g., K=1 or 2) since the calibrating DAC 54 is designed to compensate only a small amount of mismatch between the transmit and replica DACs 28, 52.

A change in the third analog output due to a one LSB change in the calibrating code may be smaller than a change in the first or the second analog outputs due to a one LSB change in the thermometer codes input to the transmit and replica DACs 28, 52. The third analog output ranges approximately from zero to one or two LSBs of the replica DAC 52. By increasing the resolution of the calibrating DAC 54 (i.e., by increasing K), the replica DAC can be accurately calibrated to less than (i.e., to a fraction of) one LSB.

When calibration begins, the thermometer code generator 58 outputs a first thermometer code to the transmit and replica DACs 28, 52. For example only, let the transmit and replica DACs 28, 52 be 3-bit segmented thermometer-coded DACs comprising seven segments. For example, the first thermometer code may be 0000001. A first segment of the transmit DAC 28 and a first segment of the replica DAC 52 convert the first thermometer code and generate the first and second analog outputs, respectively. The control module 56 outputs the calibrating code having a value 0 (or 00 depending whether K=1 or K=2) to the calibrating DAC 54. Accordingly, the third analog output is zero.

The summing circuit 64 adds the second and third analog outputs and generates the sum. The comparing module 62 compares the first analog output to the sum and generates an output indicating whether the sum is less than the first analog output. In some implementations, an ADC (not shown) may convert the output of the comparing module 62 into a digital output that indicates whether the sum is less than the first analog output.

The control module 56 receives the output of the comparing module 62. The control module 56 increments the calibrating code when the output of the comparing module 62 indicates that the sum is less than the first analog output. For example, the control module 56 increments the calibrating code from 00 to 01 when K=2. The calibrating DAC 54 converts the incremented calibrating code and generates a higher third analog output. The summing circuit 64 adds the second and the higher third analog outputs and generates a new sum. The comparing module 62 compares the first analog output to the new sum and determines whether the new sum is still less than the first analog output, etc.

When the sum of the second and third analog outputs is substantially equal to the first analog output, the control module 56 stores the calibrating code in the lookup table 68. The calibrating code that substantially equalizes the first analog output and the sum of the second and third analog outputs is called an offset. The offset generated for the first thermometer code is called a first offset. The first offset calibrates the first segment of the replica DAC 52 and matches the first segment of the replica DAC 52 to the first segment of the transmit DAC 28.

Subsequently, the thermometer code generator 58 outputs a second thermometer code to the transmit and replica DACs 28, 52. For example, the second thermometer code may be 0000011. First and second segments of the transmit DAC 28 and first and second segments of the replica DAC 52 convert the second thermometer code and generate the first and second analog outputs.

The control module 56 resets the calibrating code to 0 (or 00) and outputs the calibrating code to the calibrating DAC 54. Accordingly, the third analog output is zero. The summing, comparing, and calibrating steps described for the first thermometer code are repeated for the second thermometer code. The control module 56 generates and stores a second offset for the second thermometer code. The second offset calibrates the first and second segments of the replica DAC 52 and matches the first and second segments of the replica DAC 52 to the first and second segments of the transmit DAC 28.

The thermometer code generator 58 then outputs a third thermometer code (e.g., 0000111), and the control module 56 generates and stores a third offset. The third offset calibrates the first, second, and third segments of the replica DAC 52 to the first, second, and third segments of the transmit DAC 28. The process is followed until the last thermometer code (e.g., 1111111) is exhausted. When the last thermometer code is exhausted, all the segments of the replica DAC 52 are calibrated and match the corresponding segments of the transmit DAC 28, and the calibration is complete.

During each step of calibration (i.e., for a given thermometer code), the same segments in both the transmit and replica DACs 28, 52 convert the thermometer code. Accordingly, the same segments of the replica DAC 52 are compared (and matched) to the corresponding segments of the transmit DAC 28 when the amplified sum of the second and third analog outputs is compared (and matched) to the first analog output for the given thermometer code.

Additionally, since each segment of the replica DAC 52 is not individually compared to the corresponding segment of the transmit DAC 28, the offsets are not generated for each individual segment of the replica DAC 52. Accordingly, during normal operation, when a plurality of segments of the transmit DAC 28 converts the thermometer code corresponding to a binary codeword being transmitted, only one offset is generated for all the converting segments. Individual offsets for each of the converting segments are not used. Accordingly, during normal operation, the replica DAC 52 replicates the transmit signal efficiently.

Occasionally, the accuracy of the replica DAC 52 may differ from the accuracy of the transmit DAC 28 by a fraction of a bit (e.g., by 1.5 bits) instead of by 1 or 2 bits. Any fractional mismatch between the transmit and replica DACs 28, 52 may be compensated by increasing the number of bits (K) in the calibrating code. For example, the control module 56 may generate three-bit calibrating codes (i.e., K=3) instead of two-bit calibrating codes (i.e., K=2). Thus, if the reference voltage of the calibrating DAC 54 is $V_{ref\text{-}cal}$, the third analog outputs generated by the calibrating DAC 54 may have values that change by $(V_{ref\text{-}cal}/2^3)$ instead of $(V_{ref\text{-}cal}/2^2)$.

Accordingly, the calibrating DAC 54 can increase (or decrease) the second analog output of the replica DAC 52 by smaller increments when K=3 than when K=2. Depending on the value of $V_{ref\text{-}cal}$, adding (or subtracting) multiples of $(V_{ref\text{-}cal}/2^3)$ to (or from) the value of the second analog output can closely match the sum of the second and third analog outputs to the first analog output. In other words, the calibrating DAC 54 can reduce any mismatch between the transmit and replica DACs 28, 52 to a fraction of one LSB of the replica DAC 52.

FIG. 3C illustrates switching between the normal mode and the calibration mode of operation of the transceiver 50. The transceiver 50 comprises the transmit DAC 28, the replica DAC 52, the calibrating DAC 54, the summing circuit 64, the comparing module 62, the control module 56, the thermometer code generator 58, a the binary-to-thermometer code converter 59, a multiplexer (mux) 60, a switch S, the subtractor 66, and the ADC 38.

The control module 56 controls the mode of operation of the transceiver 50 using switches S1, S2, and S3. The switches S1, S2, and S3 may be implemented using mechanical switches or using switching devices such as diodes or transistors. Each of the switches S1, S2, and S3 switch between a normal mode position (N position) and a calibrate mode position (C position) based on control signals received from the control module 56. Using the switches S1, S2, and S3, the control module 56 may switch from the normal mode to the calibration mode, perform the calibration, and switch from the calibration mode to the normal mode. Thus, calibration may be performed periodically, for example, based on changes in temperature of the transceiver 50. Calibration may be performed on an event basis when a predetermined event occurs. For example only, calibration may occur on startup (i.e., when power is turned on).

In the normal mode, the control module 56 sets the switches S1, S2, and S3 to the N position. When the switch S1 is in N position, the switch S1 routes the output of the transmit DAC 28 to the line 18. When the switch S2 is in the N position, the switch S2 disconnects the output of the summing module 64 from the comparing module 62. When the switch S3 is in the N position, the switch S3 routes the output of the summing module 64 to the subtractor 66.

In the calibration mode, the control module 56 sets the switches S1, S2, and S3 to the C position. When the switch S1 is in C position, the switch S1 disconnects the output of the transmit DAC 28 from the line 18 and instead routes the output of the transmit DAC 28 to the comparing module 62. When the switch S2 is in the C position, the switch S2 routes the output of the summing circuit 64 to the comparing module 62. When the switch S3 is in the C position, the switch S3 disconnects the output of the summing module 64 from the subtractor 66.

In the normal mode, the mux 60 routes the output of the binary-to-thermometer code converter 59 to the transmit and replica DACs 28, 52. In the calibration mode, the mux 60 routes the output of the thermometer code generator 58 to the transmit and replica DACs 28, 52. The control module 56 controls the mux 60 by changing the state of a control signal output to the mux 60 depending on the mode of operation.

In the normal mode, the control module 56 receives the binary codewords being transmitted. When a binary codeword is being transmitted, the control module 56 looks up the offset for the thermometer code corresponding to the binary code from the lookup table 68. The control module 56 outputs the offset to the calibrating DAC 54. The calibrating DAC 54 converts the offset and generates the third analog output. The summing circuit 64 adds the third analog output to the second analog output of the replica DAC 52. The sum of the second and third analog outputs is substantially equal to the first analog output generated by the transmit DAC 28.

In other words, the replica and calibrating DACs 52, 54 replicate the transmit signal (i.e., the first analog output) generated by the transmit DAC 28. The subtractor 66 subtracts the sum, which is a replica of the transmit signal, from the combined signal received by the transceiver 50. The subtractor 66 generates the clean receive signal that does not include the transmit signal. The subtractor 66 outputs the clean receive signal to the ADC 38.

In the normal mode, the control module 56 may disconnect power to the modules and circuitry that are used in the calibration mode. For example, the control module 56 may disconnect power to the thermometer code generator 58 and the comparing module 62. Instead of disconnecting the power, the control module 56 may switch the thermometer code generator 58 and the comparing module 62 to a standby power mode.

In the calibration mode, the control module 56 may disconnect power to the modules and circuitry that are used in the normal mode. For example, the control module 56 may disconnect power to the binary-to-thermometer code converter 59, the subtractor 66, and the ADC 38. Instead of disconnecting the power, the control module 56 may switch the binary-to-thermometer code converter 59, the subtractor 66, and the ADC 38 to a standby power mode.

In some implementations, the transmit DAC 28 may be unable to drive the line 18. Accordingly, the line driver 32 may be provided between the switch S and the line 18 to drive the line 18. When the line driver 32 is used, however, an amplifier (not shown) having a gain that matches the gain of the line driver 32 may be used between the output of the summing circuit and the input of the subtractor 66 in the normal mode. Additionally, depending on the type of DACs used to implement the transmit and replica DACs 28, 52, the summing circuit 64 and the comparing module 62 may include a current/voltage summing circuit and a current/voltage comparing module, respectively.

Figure 4:
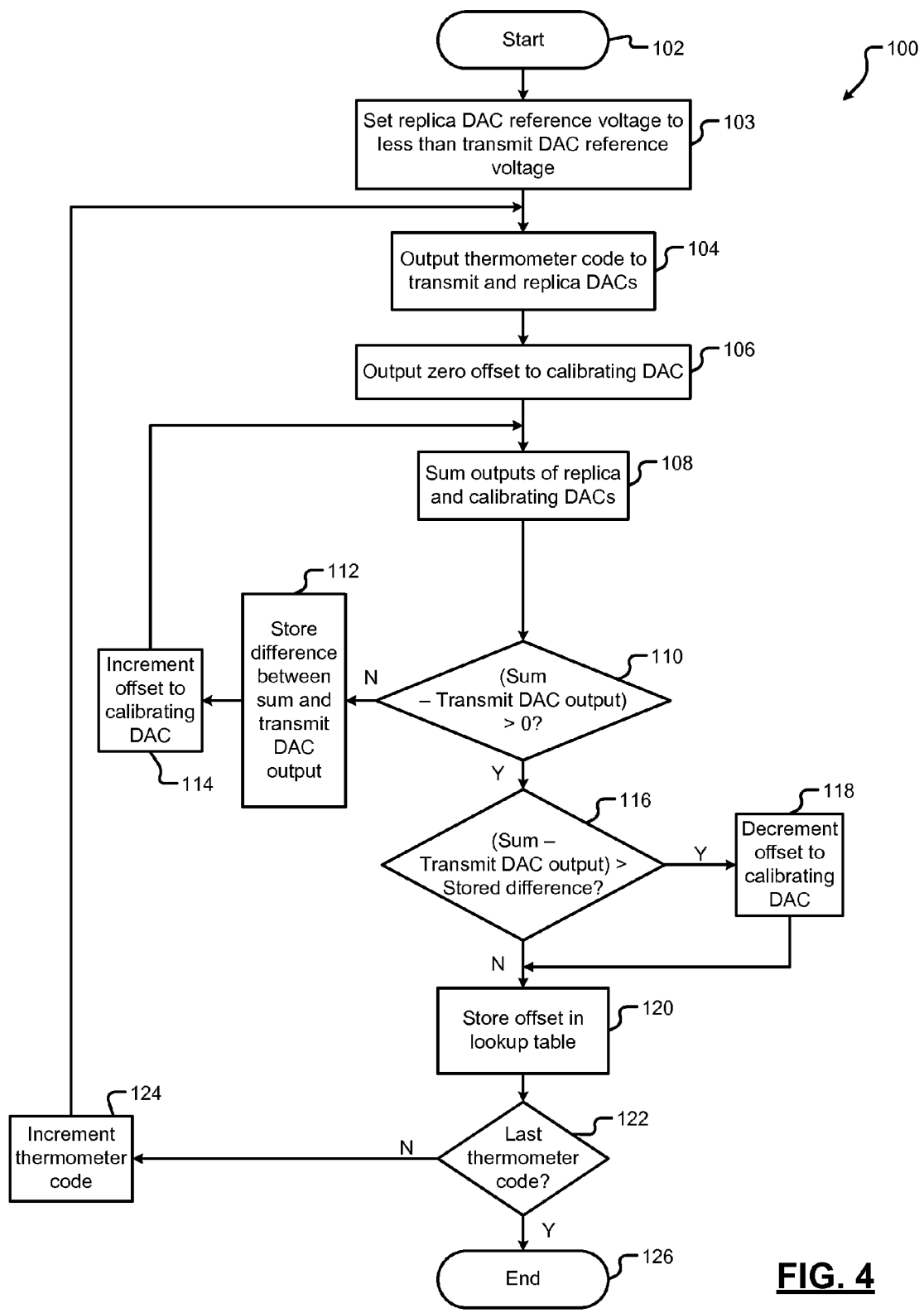
FIG. 4 is a flowchart of a method for calibrating a replica DAC according to the present disclosure.

Referring now to FIG. 4, a method 100 for calibrating the replica DAC 52 using the calibrating DAC 54 is shown. Control begins in step 102. In step 103, control sets the reference voltage supplied to the replica DAC 52 lower than the reference voltage supplied to the transmit DAC 28 so that the output of the replica DAC 52 is less than or equal to the output of the transmit DAC 28.

Control outputs the first thermometer code to the transmit and replica DACs 28, 52 in step 104. Control outputs a zero offset to the calibrating DAC 54 in step 106. Control generates the sum of the outputs of the calibrating and replica DACs 54, 52 in step 108. Control determines whether a difference between the sum and the output of the transmit DAC 28 is greater than zero in step 110. If the result of step 110 is false, control stores the difference in step 112, increments the offset output to the calibrating DAC 54 in step 114, and returns to step 108.

If the result of step 110 is true, control determines in step 116 whether the difference from a current iteration is greater than the stored difference from a previous iteration. If the result of step 116 is true, control decrements the offset output to the calibrating DAC 54 in step 118. If the result of step 116 is false, or at the end of step 118, control stores the offset in the lookup table 68 step 120.

Control determines in step 122 if the thermometer code output to the transmit and replica DACs 28, 52 is the last thermometer code. If the result of step 122 is false, control increments the code in step 124 and returns to step 104. If the result of step 122 is true, the method 100 ends in step 126.

Figure 5:
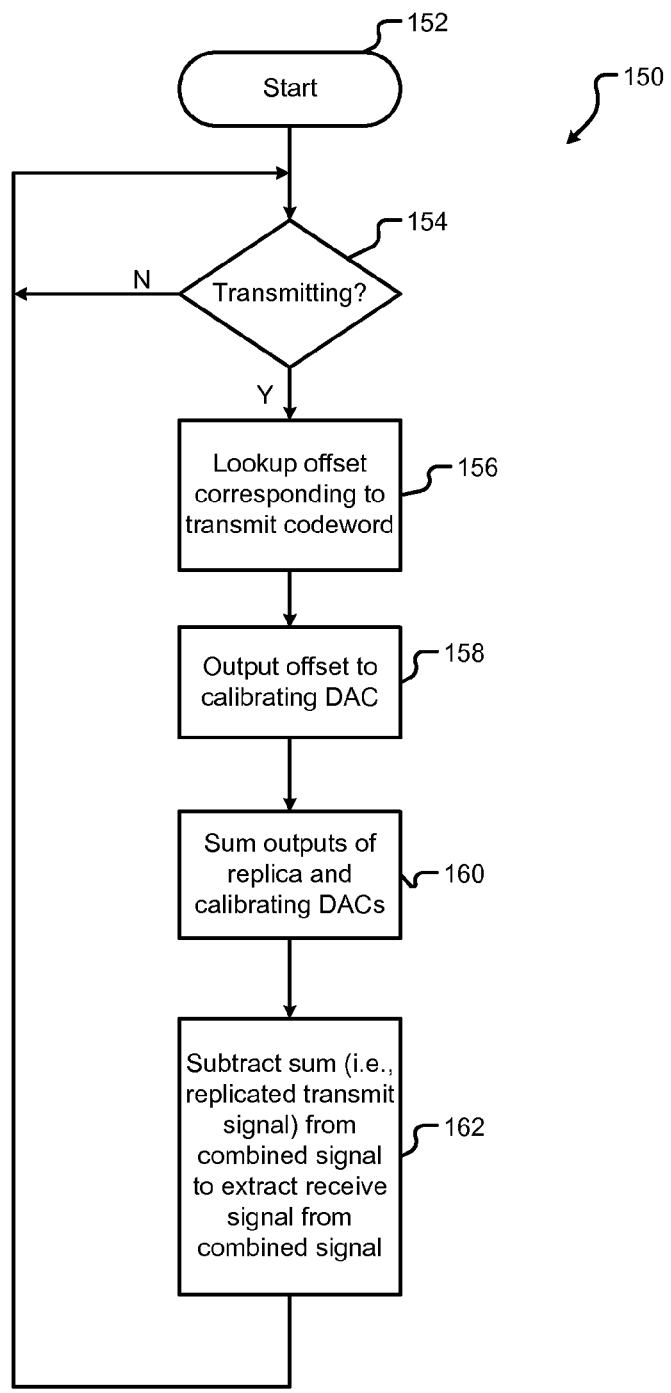
FIG. 5 is a flowchart of a method for removing transmit signals and extracting receive signals using a replica DAC according to the present disclosure.

Referring now to FIG. 5, a method 150 for removing the transmit signal and extracting the receive signal from the combined signal using the replica and calibrating DACs 52, 54 is shown. Control begins in step 152. Control determines in step 154 if the transceiver 50 is transmitting codewords. If the result of step 154 is false, control waits until the transceiver 50 transmits the transmit codeword. If the result of step 154 is true, control looks up an offset for the thermometer code corresponding to the transmit codeword from the lookup table 68 in step 156. Control outputs the offset to the calibrating DAC 54 in step 158.

In step 160, control generates the sum of the outputs of the replica and calibrating DACs 52, 54 and replicates the transmit signal output by the transmit DAC 28. In step 162, control subtracts the sum (i.e., the replicated transmit signal) from the combined signal to remove the transmit signal from the combined signal and extracts the receive signal from the combined signal. Control returns to step 154.

Referring now to FIGS. 6A-6E, various exemplary implementations incorporating the teachings of the present disclosure are shown.

Figure 6B:
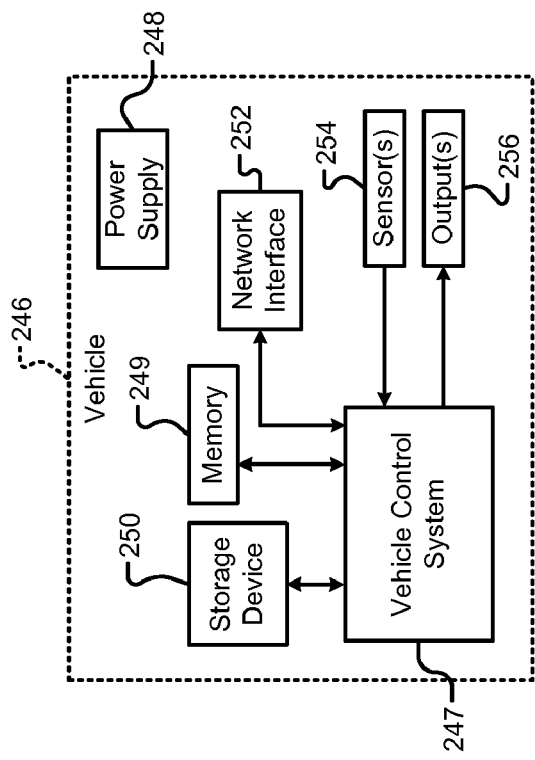
FIG. 6B is a functional block diagram of a vehicle control system.
Figure 6A:
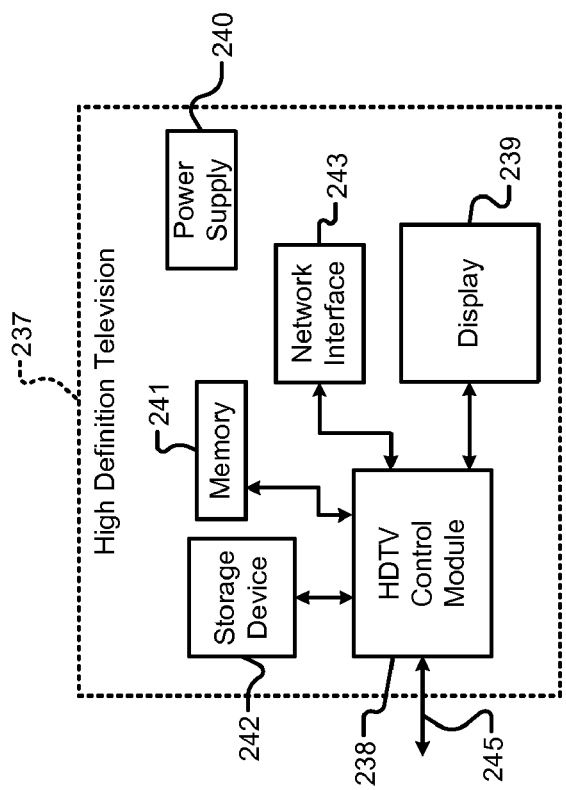
FIG. 6A is a functional block diagram of a high definition television.

In FIG. 6A, the teachings of the disclosure can be implemented in a network interface 243 of a high definition television (HDTV) 237 to calibrate a replica DAC that replicates transmit signals generated by a transmit DAC used in the network interface 243. The HDTV 237 includes an HDTV control module 238, a display 239, a power supply 240, memory 241, a storage device 242, the network interface 243, and an external interface 245. When the network interface 243 includes a wireless local area network (WLAN) interface, an antenna (not shown) may be included.

The HDTV 237 can receive input signals from the network interface 243 and/or the external interface 245, which can send and receive data via cable, broadband Internet, and/or satellite. The HDTV control module 238 may process the input signals, including encoding, decoding, filtering, and/or formatting, and generate output signals. The output signals may be communicated to one or more of the display 239, memory 241, the storage device 242, the network interface 243, and the external interface 245.

Memory 241 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 242 may include an optical storage drive, such as a DVD drive, and/or a hard disk drive (HDD). The HDTV control module 238 communicates externally via the network interface 243 and/or the external interface 245. The power supply 240 provides power to the components of the HDTV 237.

In FIG. 6B, the teachings of the disclosure may be implemented in a network interface 252 of a vehicle 246 to calibrate a replica DAC that replicates transmit signals generated by a transmit DAC used in the network interface 252. The vehicle 246 may include a vehicle control system 247, a power supply 248, memory 249, a storage device 250, and the network interface 252. When the network interface 252 includes a wireless local area network (WLAN) interface, an antenna (not shown) may be included. The vehicle control system 247 may be a powertrain control system, a body control system, an entertainment control system, an anti-lock braking system (ABS), a navigation system, a telematics system, a lane departure system, an adaptive cruise control system, etc.

The vehicle control system 247 may communicate with one or more sensors 254 and generate one or more output signals 256. The sensors 254 may include temperature sensors, acceleration sensors, pressure sensors, rotational sensors, airflow sensors, etc. The output signals 256 may control engine operating parameters, transmission operating parameters, suspension parameters, brake parameters, etc.

The power supply 248 provides power to the components of the vehicle 246. The vehicle control system 247 may store data in memory 249 and/or the storage device 250. Memory 249 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 250 may include an optical storage drive, such as a DVD drive, and/or a hard disk drive (HDD). The vehicle control system 247 may communicate externally using the network interface 252.

Figure 6D:
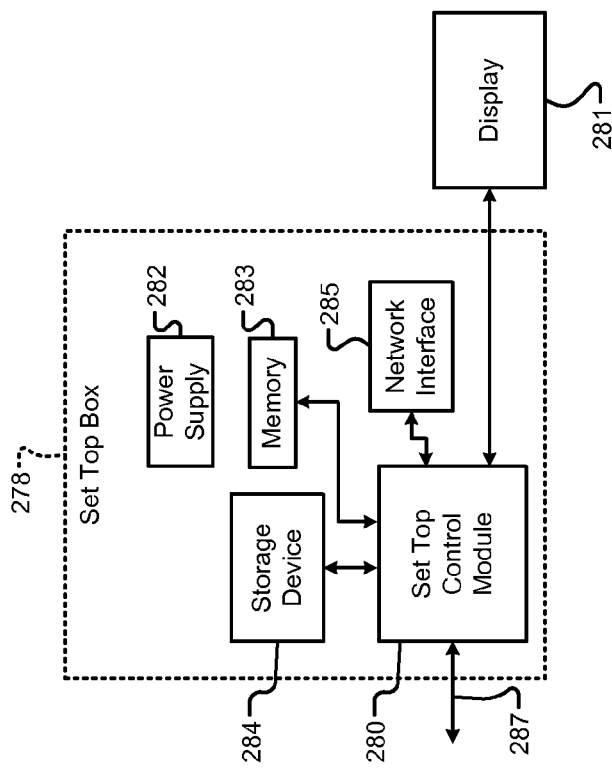
FIG. 6D is a functional block diagram of a set top box.
Figure 6C:
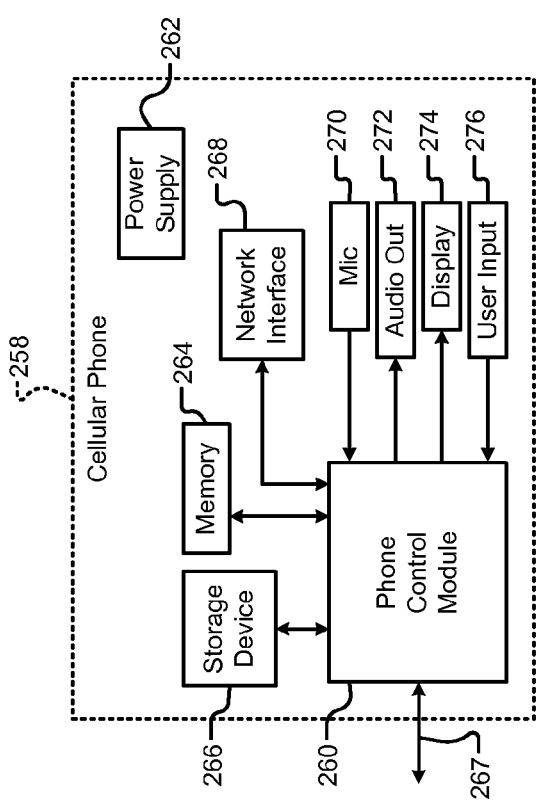
FIG. 6C is a functional block diagram of a cellular phone.

In FIG. 6C, the teachings of the disclosure can be implemented in a network interface 268 of a cellular phone 258 to calibrate a replica DAC that replicates transmit signals generated by a transmit DAC used in the network interface 268. Alternatively or additionally, the teachings of the disclosure can be implemented in a cellular network interface 267 of the cellular phone 258 to calibrate a replica DAC that replicates transmit signals generated by a transmit DAC used in the cellular network interface 267.

The cellular phone 258 includes a phone control module 260, a power supply 262, memory 264, a storage device 266, and the cellular network interface 267. The cellular phone 258 may include the network interface 268, a microphone 270, an audio output 272 such as a speaker and/or output jack, a display 274, and a user input device 276 such as a keypad and/or pointing device. When the network interface 268 includes a wireless local area network (WLAN) interface, an antenna (not shown) may be included.

The phone control module 260 may receive input signals from the cellular network interface 267, the network interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the network interface 268, and the audio output 272.

Memory 264 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 266 may include an optical storage drive, such as a DVD drive, and/or a hard disk drive (HDD). The power supply 262 provides power to the components of the cellular phone 258.

In FIG. 6D, the teachings of the disclosure can be implemented in a network interface 285 of a set top box 278 to calibrate a replica DAC that replicates transmit signals generated by a transmit DAC used in the network interface 285. The set top box 278 includes a set top control module 280, a display 281, a power supply 282, memory 283, a storage device 284, and the network interface 285. When the network interface 285 includes a wireless local area network (WLAN) interface, an antenna (not shown) may be included.

The set top control module 280 may receive input signals from the network interface 285 and an external interface 287, which can send and receive data via cable, broadband Internet, and/or satellite. The set top control module 280 may process signals, including encoding, decoding, filtering, and/or formatting, and generate output signals. The output signals may include audio and/or video signals in standard and/or high definition formats. The output signals may be communicated to the network interface 285 and/or to the display 281. The display 281 may include a television, a projector, and/or a monitor.

The power supply 282 provides power to the components of the set top box 278. Memory 283 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 284 may include an optical storage drive, such as a DVD drive, and/or a hard disk drive (HDD).

Figure 6E:
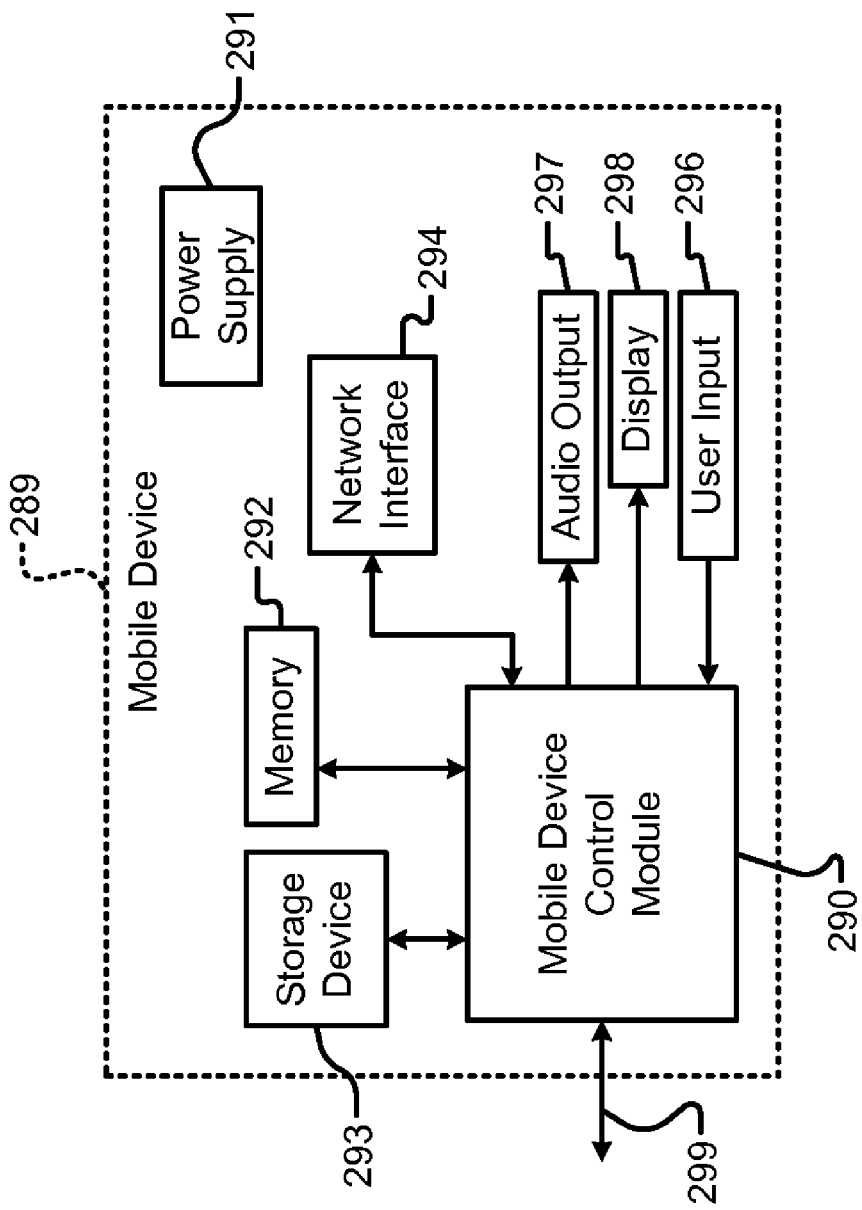
FIG. 6E is a functional block diagram of a mobile device.

In FIG. 6E, the teachings of the disclosure can be implemented in a network interface 294 of a mobile device 289 to calibrate a replica DAC that replicates transmit signals generated by a transmit DAC used in the network interface 294. The mobile device 289 may include a mobile device control module 290, a power supply 291, memory 292, a storage device 293, the network interface 294, and an external interface 299. When the network interface 294 includes a wireless local area network (WLAN) interface, an antenna (not shown) may be included.

The mobile device control module 290 may receive input signals from the network interface 294 and/or the external interface 299. The external interface 299 may include USB, infrared, and/or Ethernet. The input signals may include compressed audio and/or video, and may be compliant with the MP3 format. Additionally, the mobile device control module 290 may receive input from a user input 296 such as a keypad, touchpad, or individual buttons. The mobile device control module 290 may process input signals, including encoding, decoding, filtering, and/or formatting, and generate output signals.

The mobile device control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the mobile device 289. Memory 292 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 293 may include an optical storage drive, such as a DVD drive, and/or a hard disk drive (HDD). The mobile device 289 may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
    a first digital-to-analog converter to convert a digital signal into a corresponding first analog signal;
    a replica digital-to-analog converter to generate a second analog signal based on the digital signal, wherein the second analog signal approximately matches the first analog signal;
    a control module to generate a calibration code based on the digital signal; and
    a calibrating digital-to-analog converter to generate a third analog signal based on the calibration code, wherein the third analog signal substantially corresponds to a mismatch between the first analog signal and the second analog signal.

2. The system of claim 1, further comprising a summing module to sum the second analog signal and the third analog signal.

3. The system of claim 2, further comprising:
    a comparing module to compare the first analog signal to the sum of the second analog signal and the third analog signal,
    wherein the calibration code is adjusted based on the comparison of the first analog signal to the sum of the second analog signal and the third analog signal.

4. The system of claim 2, wherein the first analog signal is to be transmitted over a transmission medium.

5. The system of claim 4, wherein:
    the system is configured to receive a combined signal through the transmission medium, wherein the combined signal is a composition of (i) the first analog signal transmitted over the transmission medium and (ii) a signal transmitted by a remote device over the transmission medium; and
    the system further comprises
        a subtractor to subtract the sum of the second analog signal and the third analog signal from the combined signal in order to recover the signal transmitted by a remote device over the transmission medium.

6. The system of claim 5, wherein the transmission medium comprises a wireless medium.

7. The system of claim 5, wherein the transmission medium comprises a wired medium.

8. The system of claim 7, wherein the wired medium comprises unshielded twisted-pair wires.

9. The system of claim 5, wherein the system comprises a transceiver.

10. A device comprising the transceiver of claim 9.

11. The device of claim 10, wherein the device comprises a high definition television, a cellular phone, a set top box, or a mobile device.

12. The system of claim 1, wherein the calibration code comprises binary codes or thermometer codes.

13. A method comprising:
    converting a digital signal into a corresponding first analog signal;
    generating a second analog signal based on the digital signal, wherein the second analog signal approximately matches the first analog signal;
    generating a calibration code based on the digital signal; and
    generating a third analog signal based on the calibration code, wherein the third analog signal substantially corresponds to a mismatch between the first analog signal and the second analog signal.

14. The method of claim 13, further comprising summing the second analog signal and the third analog signal.

15. The method of claim 14, further comprising transmitting the first analog signal over a transmission medium.

16. The method of claim 15, further comprising:
    receiving a combined signal through the transmission medium, wherein the combined signal is a composition of (i) the first analog signal transmitted over the transmission medium and (ii) a signal transmitted by a remote device over the transmission medium; and
    subtracting the sum of the second analog signal and the third analog signal from the combined signal in order to recover the signal transmitted by a remote device over the transmission medium.

17. The method of claim 16, wherein the transmission medium comprises a wireless medium.

18. The method of claim 16, wherein the transmission medium comprises a wired medium.

19. The method of claim 18, wherein the wired medium comprises unshielded twisted-pair wires.

20. The method of claim 13, wherein the calibration code comprises binary codes or thermometer codes.

* * * * *